United States Patent [19]

Otofuji

[11] 4,158,149
[45] Jun. 12, 1979

[54] ELECTRONIC SWITCHING CIRCUIT USING JUNCTION TYPE FIELD-EFFECT TRANSISTOR

[75] Inventor: Kiyoshi Otofuji, Kodaira, Japan

[73] Assignee: Hitachi Denshi Kabushiki Kaisha, Japan

[21] Appl. No.: 849,646

[22] Filed: Nov. 8, 1977

[30] Foreign Application Priority Data

May 16, 1977 [JP] Japan ................... 52-55353

[51] Int. Cl.² .................. H03K 17/60; H03K 17/02
[52] U.S. Cl. ................ 307/251; 307/200 B; 307/352
[58] Field of Search ............ 307/200 B, 251, 304, 307/352, 353; 328/151, 165, 167

[56] References Cited

U.S. PATENT DOCUMENTS

| | | | |
|---|---|---|---|
| 3,325,654 | 6/1967 | Mrazek | 307/251 X |
| 3,412,266 | 11/1968 | Tarico | 307/251 |
| 3,414,737 | 12/1968 | Bowers, Jr. | 307/251 X |
| 3,448,293 | 6/1969 | Russell | 307/251 |
| 3,509,374 | 4/1970 | Lockshaw | 307/251 X |
| 3,731,116 | 5/1973 | Hill | 307/251 |
| 3,902,078 | 8/1975 | Peterson | 323/22 R X |
| 3,908,136 | 9/1975 | Desperques-Volmier | 307/251 |
| 3,955,103 | 5/1976 | Russell et al. | 307/251 |
| 4,009,401 | 2/1977 | Sasaki | 307/251 |
| 4,052,623 | 10/1977 | Loberg | 307/251 |

FOREIGN PATENT DOCUMENTS

1961255  7/1970  Fed. Rep. of Germany ........... 307/251

OTHER PUBLICATIONS

McCarthy, "Fast Slew Rate Control System"; IBM Tech. Discl. Bull.; vol. 13, No. 2, pp. 552–523; 7/1970.

*Primary Examiner*—Larry N. Anagnos
*Attorney, Agent, or Firm*—Craig and Antonelli

[57] ABSTRACT

In an electronic switching circuit using a junction type field-effect transistor, a capacitor is connected between the gate electrode of the transistor and a control pulse source. The capacitor is cooperative with a rectifying action of the gate electrode of the transistor to supply to the gate of the transistor a switching voltage which is different from the potential level of the control pulse from the control pulse source and is DC-restored following an input signal applied to the transistor.

5 Claims, 2 Drawing Figures

ELECTRONIC SWITCHING CIRCUIT USING JUNCTION TYPE FIELD-EFFECT TRANSISTOR

FIELD OF THE INVENTION

This invention relates to the improvement in an electronic switching circuit for analog signals in which a junction type field-effect transistor (hereinafter referred to as J-FET) is used.

DESCRIPTION OF THE PRIOR ART

A variety of electronic switching circuits using J-FETs as switching elements have hitherto been proposed depending upon their uses.

In a typical example of such J-FET type electronic switching circuits, an input signal $e_i$ supplied to an input terminal connected with a first electrode of the J-FET is delivered as an output signal $e_o$ at an output terminal connected with a second electrode of the J-FET through a switching operation of the J-FET. To that end, control pulses from a control pulse source are supplied through a level shifting circuit to the base of a transistor whose collector is connected through a diode with a third or gate electrode of the J-FET. A voltage of $-E_2$ is applied to the emitter of the transistor and a voltage of $+E_1$ is applied through a resistor to the collector of the transistor. The diode has its cathode connected with the collector of the transistor and its anode with the gate electrode of the J-FET.

Such a J-FET type electronic switching circuit is broadly used since it can operate on an irregular and discrete input pulse signal $e_i$ and since it imposes rather gentle restrictions on the control pulses. Also, it has a feature that the dynamic voltage range of the input signal $e_i$ capable of being switched by the J-FET can be expanded with the increase of the absolute values of the voltages $+E_1$ and $-E_2$.

However, the J-FET type electronic switching circuit, with its too much emphasized flexibility in uses, cannot be free from a circuit element which can be substantially omitted in the case where the control pulses are regular as in a synchronizing signal in a television signal and have their amplitudes greater than the pinch-off voltage of the J-FET. If the electronic switching circuit in question is therefore used only for a restricted range of uses, some suitable simplification would be devised.

SUMMARY OF THE INVENTION

This invention has been made in view of the above aspect and aims at providing an improved J-FET type electronic switching circuit which has a simple structure.

According to a J-FET type electronic switching circuit of this invention, an input signal is switched by directly applying a pulse signal from a pulse signal source to the gate electrode of a J-FET through a capacitor.

DESCRIPTION OF THE PREFERRED EMBODIMENTS

Figure 1:
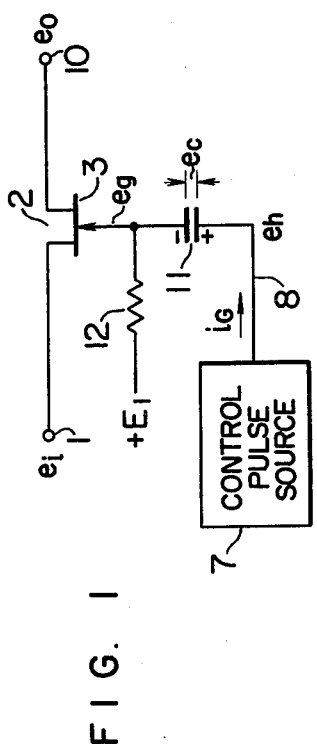
FIG. 1 shows a J-FET type electronic switching circuit as an embodiment of this invention.

In FIG. 1 showing a J-FET type electronic switching circuit as an embodiment of this invention, a J-FET 2 serving as a switching element receives an input signal $e_i$ at its first electrode through an input terminal 1 and delivers an output signal $e_o$ at its second electrode connected with an output terminal 10. An output 8 of a control pulse source 7 is applied to a third or gate electrode 3 of the J-FET 2 through a capacitor 11 and a voltage $+E_1$ is also applied to the gate electrode 3 of the J-FET 2 through a resistor 12.

Figure 2:
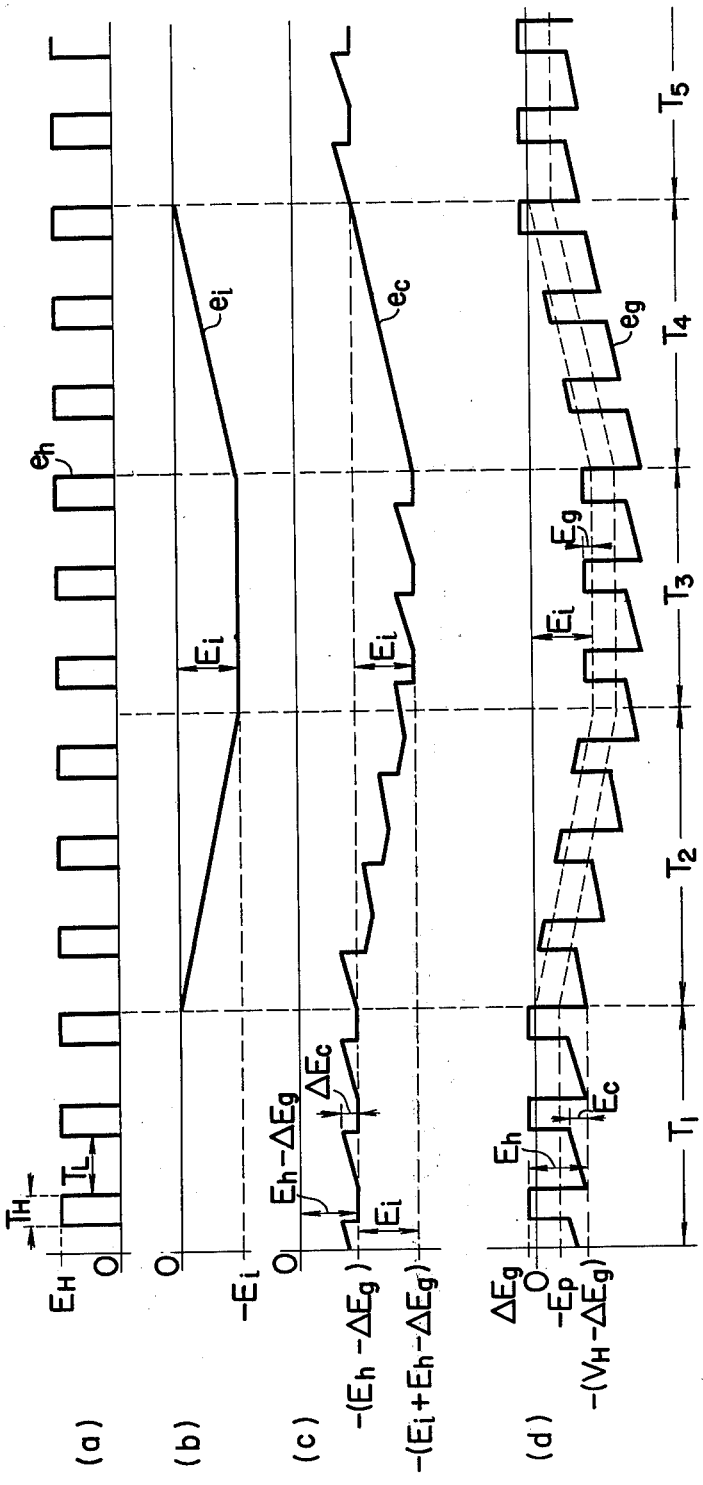
FIG. 2 shows waveforms useful in explaining the operation of the circuit of FIG. 1.

FIG. 2 shows waveforms appearing at several points in the circuit of FIG. 1. Waveform (a) represents the output 8 which is a train of regular pulses and has a pulse amplitude $E_H$ during each pulse duration $T_H$ and a pulse interval $T_L$ during which no voltage appears. Waveform (b) represents the input signal $e_i$ which has a voltage equal to "0" during periods $T_1$ and $T_5$, varies linearly from "0" to $-E_i$ during a period $T_2$, is equal to $-E_i$ during a period $T_3$ and varies linearly from $-E_i$ to "0" during a period $T_4$. Waveform (c) represents the voltage $e_c$ charge in the capacitor 11. Waveform (d) represents the voltage $e_g$ applied to the gate electrode 3.

During the period $T_1$, the input signal $e_i$ has a voltage "0" and the pulse signal as the output 8 is supplied to the gate electrode 3. In this case, the output 8 has during the period $T_H$ a voltage level high enough to turn the J-FET 2 on, so that the gate electrode 3 draws a gate current $i_G$ during the period $T_H$. Accordingly, a voltage drop of $-\Delta E_g$ is caused between the gate electrode 3 and the other electrode, e.g. the first electrode connected with the input terminal 1 and therefore a voltage of $-(E_h-\Delta E_g)$ is DC-restored, that is, charged in the capacitor 11. Since the resistor 12 has a high resistance value, the variation of the voltage due to the discharging current flowing through the resistor 12 and the gate electrode during the period $T_L$ (i.e. the pulse interval of the output 8) is equal to $\Delta E_c$. Since the value of voltage $-(E_h-\Delta E_g-\Delta E_c)$ is sufficiently greater than pinch-off voltage $-V_p$ of the J-FET 2, the J-FET 2 is not gated or not turned on during the period $T_L$. The input signal $e_i$ is at the voltage of "0" during the period $T_1$ and therefore a voltage "0"$-E_H$ is charged in the capacitor 11 if the voltages of $\Delta E_g$ and $\Delta E_c$ are reglected. The J-FET 2 is turned on and off according to the output 8 so that the output signal $e_o$ at the output terminal 10 is almost equal to "0".

During the period $T_2$, the input signal $e_i$ changes from "0" toward $-E_i$. In this case, too, the J-FET 2 is gated or turned on during the period $T_H$ (i.e. the pulse duration of the output 8), as during the period $T_1$. When the J-FET 2 is gated during the period $T_2$, the capacitor 11 also charges the input signal $e_i$ for that period. Namely, if the voltages of $\Delta E_g$ and $\Delta E_c$ are neglected, a voltage of $e_i-E_h$ is charged in the capacitor 11. Accordingly, the J-FET 2 is turned on or off according to the output 8 so that the output $e_o$ in the form of an intermitted version of the input signal $e_i$ is delivered at the output terminal 10.

During the period $T_3$, the input signal $e_i$ becomes constant at $-E_i$. In this case, too, the J-FET 2 is gated during the period $T_H$ (i.e. the pulse duration of the output 8), as during the period $T_1$. When the J-FET 2 is gated during the period $T_3$, a voltage of $-E_i-E_h$ is charged in the capacitor 11 if the voltages of $\Delta E_g$ and $\Delta E_c$ are neglected. Then, as seen from the foregoing, the output signal $e_o$ substantially in the form of an intermitted version of the input signal $e_i$ is delivered at the output terminal 10.

During the period $T_4$, the input signal $e_i$ changes from $-E_i$ toward "0". In this case, unless the change $\Delta E_i$ in the voltage of the input signal $e_i$ exceeds $\Delta E_c$, the bias voltage between the gate electrode 3 and the first electrode of the J-FET 2 connected with the input terminal 1 remains the same as in the periods $T_1$-$T_3$ so that the J-FET 2 is turned on during the period $T_H$ and off during the period $T_L$. Consequently, a voltage of $e_i - E_h$ is charged in the capacitor 11 if the voltages of $\Delta E_g$ and $\Delta E_c$ are neglected, and therefore the output signal $e_o$ substantially in the form of an intermitted version of the input signal $e_i$ is delivered at the output terminal 10.

During the period $T_5$, the input signal $e_i$ assumes a voltage of "0". As apparent from the previous description, the output signal $e_o$ having a voltage of "0" is delivered at the output terminal 10.

As described above, according to this invention, the input signal $e_i$, whether it is of DC or AC, can be switched. This is possible because the capacitor 11 is repeatedly charged or discharged so that the voltage $e_c$ across the capacitor 11 may follow the input signal $e_i$ and because the voltage $e_g$ at the gate electrode 3 of the J-FET 2 is controlled in the state of the bias capable of switching the J-FET 2. Namely, the voltage $e_g$ at the gate electrode 3 is DC-restored as an optimal bias so as to follow the voltage of the input signal $e_i$ no matter what waveform the input signal $e_i$ may have.

Now, description will be made of the points to pay attention to in embodying this invention.

The output 8 of the control pulse source 7 needs to have a voltage amplitude greater than the pinch-off voltage "$-V_p$" of the J-FET 2. Also, the control pulses must be a train of successively generated pulses, which is necessarily apparent from the above description. For example, a control pulse signal such as a television synchronizing pulse signal will suffice which includes pulses each having a voltage amplitude as great as 4 V. Moreover, the control pulse signal need not necessarily have a constant pulse duration and a constant pulse repetition period, but any pulse signal may be used that satisfies the above-mentioned conditions. Further, the frequencies of the AC components in the input signal $e_i$ must be limited to small values in this invention. This is because the voltage $E_g$ at the gate electrode 3 follows the input signal $e_i$ while being DC-restored. However, in the case where the input signal $e_i$ is the APL (average picture level) signal used in the television system, the frequencies of the AC components of the input signal $e_i$ are sufficiently lower than the switching frequency by the signal output 8. Usually, such a case occurs frequently and therefore the problem of frequency seldom arises.

According to this invention, the capacitor 11 having the function of DC-restoration is charged during the period $T_H$. For that period, a PN junction between the gate electrode 3 and the other electrode of the J-FET 2 is forward-biased so that the J-FET 2 is turned on. Consequently, the circuit has a tendency that the rectifying action of the gate electrode 3 causes the charging current to affect the input or output signal $e_i$ or $e_o$. Fortunately, according to this invention, the capacitor 11 is charged during the time for which the J-FET 2 is conductive and the input and output terminals 1 and 10 are connected with each other through the low resistance of the conducting J-FET 2 so that the above-mentioned influence is very small and therefore can be regarded as an offset voltage within allowance.

The function of the resistor 12 will now be described. As apparent from the foregoing description, the resistor 12 is an element for supplying a discharging bias current in the DC-restoration circuit including the capacitor 11. It is therefore necessary to choose the voltage $+E_1$ for supplying the bias current to be higher than at least the input signal $e_i$. In this case, the resistor 12 may be connected with the input terminal 1 instead of being supplied with the voltage $+E_1$. Further, the resistor 12 may be omitted if a leak current flowing between the gate electrode 3 and the other electrode of the J-FET 2 is used as a small bias current. In that case, the bias current is too small to attenuate the DC-restored voltage and the response characteristic with respect to the input signal $e_i$ may be degraded. As described above, however, this seldom causes a problem.

The circuit shown in FIG. 1 is a mere embodiment of this invention and by no means puts restrictions on this invention. For example, the J-FET used in the electronic switching circuit need not be exclusively of N-type but may be of P-type.

As described above, according to the electronic switching circuit of this invention, a high speed switching operation can be effected with little power consumption and little noise generated by the use of the simple constitution that the control pulse signal is supplied to the gate electrode 3 of the J-FET 2 through the capacitor 11. With this simple constitution, the circuit according to this invention leads directly to reduction of costs.

I claim:
1. An electronic switching circuit comprising:
  a junction type field-effect transistor as a switching element having a first electrode for receiving an input signal, a second electrode for delivering an output signal and a gate electrode; and
  a capacitor connected to form the only connection path between the gate electrode of said transistor and a control pulse source which generates control pulses, said capacitor being cooperative with a rectifying action of the gate electrode of said transistor to supply to the gate electrode of said transistor a switching voltage which is different from the potential level of said control pulse and is DC-restored following said input signal.

2. An electronic switching circuit according to claim 1, wherein the amplitude of said control pulse is greater than the pinch-off voltage of said transistor.

3. An electronic switching circuit according to claim 1, wherein said control pulses are a train of regular pulses having a constant period.

4. An electronic switching circuit according to claim 1, further comprising a resistor having one end connected with the gate electrode of said transistor and the other end connected with a source of a voltage higher than said input signal.

5. An electronic switching circuit according to claim 1, wherein said capacitor stores a charge during the period when a control pulse is generated and said stored charge prevents the junction type field-effect transistor from being gated on during periods when a control pulse is not generated.

* * * * *